United States Patent [19]

Iwasa

[11] Patent Number: 5,089,866
[45] Date of Patent: Feb. 18, 1992

[54] TWO-TRANSISTOR TYPE NON-VOLATILE SEMICONDUCTOR MEMORY

[75] Inventor: Shoichi Iwasa, Tokyo, Japan

[73] Assignee: NEC Corporation, Tokyo, Japan

[21] Appl. No.: 558,363

[22] Filed: Jul. 27, 1990

[30] Foreign Application Priority Data

Jul. 27, 1989 [JP] Japan .................................. 1-194794

[51] Int. Cl.$^5$ ............................................ H01L 29/78
[52] U.S. Cl. .................................... 357/23.5; 357/23.7;
357/23.11; 357/41; 357/49; 357/52; 357/55
[58] Field of Search ................... 357/23.5, 23.7, 23.11,
357/41, 49, 52, 55

[56] References Cited

U.S. PATENT DOCUMENTS 4,778,775  10/1988  Tzeng .................................. 357/23.7

OTHER PUBLICATIONS

J. Pathak et al., "A 50 MHz CMOS Programmable Logic Device", ISSCC '88, THAM 11.4, pp. 144-145.

Primary Examiner—Edward J. Wojciechowicz
Attorney, Agent, or Firm—Sughrue, Mion, Zinn, Macpeak & Seas

[57] ABSTRACT

A non-volatile semiconductor memory comprises a P-type semiconductor substrate having an active region defined by a field isolation region, and a non-volatile memory cell composed of a floating gate N-channel transistor for programming and a floating gate P-channel transistor for reading. The floating gate N-channel transistor is formed in the active region of the substrate. The flaoting gate P-channel transistor includes a source region and a drain region both formed in a conductive semiconductor layer located in the field isolation region, a floating gate formed through an insulating layer above a portion of the conductive semiconductor layer between the source region and the drain region, and a control gate formed through an insulating layer above the floating gate. The floating gate of the P-channel transistor is formed of an extension of a floating gate of the N-channel transistor, and the control gate of the P-channel transistor is connected commonly to a control gate of the N-channel transistor.

7 Claims, 3 Drawing Sheets

TWO-TRANSISTOR TYPE NON-VOLATILE SEMICONDUCTOR MEMORY

BACKGROUND OF THE INVENTION

1. Field of the Invention

The present invention relates to a non-volatile semiconductor memory, and more specifically to a ultra-violet erasable electrically programmable read only memory in which each elementary bit or each memory cell is composed of two-transistors assigned to a reading transistor and a writing transistor, respectively.

2. Description of Related Art

In the prior art, it has been said that this type of non-volatile semiconductor memory is not generally suitable to a large capacity ROM (read only memory), since each elementary bit or each memory cell is composed of two transistors. However, a transistor exclusively used for reading can be configured to have a decreased threshold voltage and an enlarged channel width, so that a so-called ON current will be large. Therefore, a reading can be executed at a high speed. On the other hand, a transistor exclusively used for writing can be configured to have a substrate impurity concentration for maximizing a writing efficiency, without paying consideration to the ON current at the reading time. Therefore, a writing speed can be elevated.

Conventionally, one EPROM (ultra-violet erasable electrically programmable read only memory) of the two-transistor type has been proposed by J. Pathak et al "A 50 MHz CMOS Programmable Logic Device", ISSCC '88, THAM 11.4, pp 144–145. This conventional EPROM cell is configured to realize a high speed reading. However, it sacrifices a cell area, namely, an integration density. In brief, the conventional EPROM cell is such that a floating gate of a writing transistor and a floating gate of a reading transistor are formed of the same layer at the same level. In addition, a drain of the reading transistor is connected to the substrate itself. This means that a plurality of reading transistors are connected in parallel to a corresponding reading digit line.

In this conventional EPROM cell of the two-transistor type, it is considered from a conventional writing method for EPROMs that a writing voltage is applied between a control gate and a source of the writing transistor while applying a certain voltage between the source and a drain of the writing transistor, so as to turn on a channel of the same writing transistor. In this connection, in order to permit to write a arbitrary bit or memory cell, the transistors of each memory cell are connected in parallel to a digit line (called "parallel arrangement" hereinafter), not in series to a digit line (called "series arrangement" hereinafter). It should be noted that all conventional ROMs including one-transistor type ROMs have been of the "parallel arrangement". In the two-transistor type EPROM, however, the above mentioned demand permitting to write a arbitrary bit or memory cell is directed to the writing transistor, but it is not inevitably required for the reading transistor.

As will be seen from the above, the conventional two-transistor type EPROM has been disadvantageous in that it requires a large cell ares, since not only the writing transistors but also the reading transistors are located in the "parallel arrangement", in addition to the fact that an enlarged cell area is required because one transistor is replaced with two transistors.

SUMMARY OF THE INVENTION

Accordingly, it is an object of the present invention to provide a two-transistor type non-volatile memory which has overcome the above mentioned defect of the conventional one.

Another object of the present invention is to provide a two-transistor type non-volatile memory having a high integration density and a simplified connection wiring.

The above and other objects of the present invention are achieved in accordance with the present invention by a non-volatile semiconductor memory comprising a semiconductor substrate of a first conduction type having an active region defined by a field isolation region formed on a principal surface of the substrate; and a non-volatile memory cell composed of a first transistor for programming and a second transistor for reading. The first transistor includes a source region and a drain region both formed in the active region separately from each other, both of the source region and the drain region being of a second conduction type different from the first conduction type, a floating gate formed through an insulating layer above a portion of the active region between the source region and the drain region, and a control gate formed through an insulating layer above the floating gate. The second transistor includes a source region and a drain region both formed in a conductive semiconductor layer located in the field isolation region, a floating gate formed through an insulating layer above a portion of the conductive semiconductor layer between the source region and the drain region, and a control gate formed through an insulating layer above the floating gate. The floating gate of the second transistor is formed of an extension of the floating gate of the first transistor, and the control gate of the second transistor is connected commonly to the control gate of the first transistor.

In a preferred embodiment, the first transistor for programming is of an N-channel MOS (metal-oxide-semiconductor) transistor and a second transistor for reading is of a P-channel MOS transistor. In this case, if a writing is executed to the first transistor for programming, since the floating gate is common to the first and second transistor, a threshold of the second transistor for reading is modified so that the second transistor for reading is apparently converted into a depletion type. Accordingly, if respective second transistors of a plurality of two-transistor type memory cells are connected in series in a reading digit line, a NAND type EPROM can be constituted.

The above and other objects, features and advantages of the present invention will be apparent from the following description of preferred embodiments of the invention with reference to the accompanying drawings.

DESCRIPTION OF THE PREFERRED EMBODIMENTS

Figure 1:
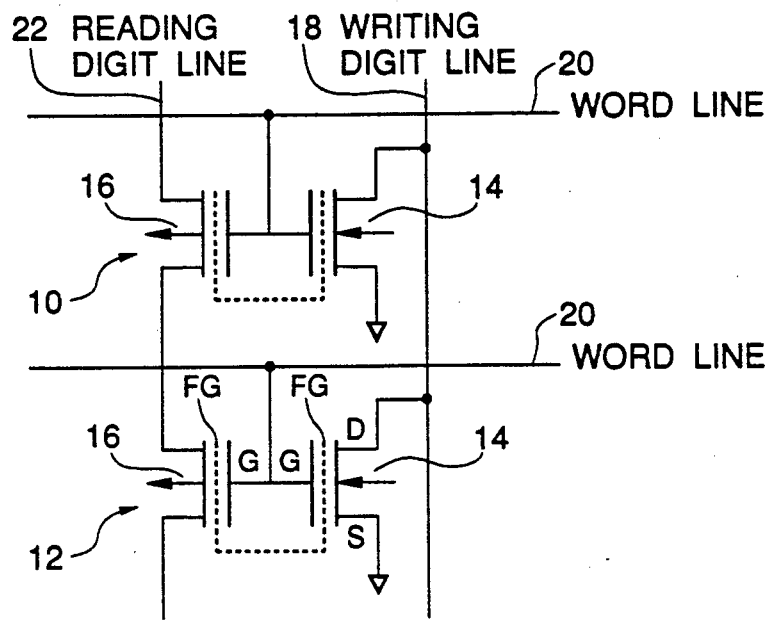
FIG. 1 is an equivalent circuit diagram of a first embodiment of the two-transistor type non-volatile memory in accordance with the present invention.

Referring to FIG. 1, there is shown an equivalent circuit diagram of a first embodiment of the two-transistor type EPROM memory in accordance with the present invention. The two-transistor type non-volatile memory includes a number of memory cells arranged in the form of a matrix, but for simplification of drawing, only two memory cells 10 and 12 are shown in FIG. 1. Each of the memory cells 10 and 12 is composed of an N-channel floating gate transistor 14 for programming or writing, and a P-channel floating gate transistor 16 for reading.

The N-channel transistor 14 has a drain D connected to a writing bit or digit line 18, a source S connected to ground, a floating gate FG located above a channel region between the source S and the drain D through a gate insulator, and a control gate G located above the floating gate FG through another gate insulator and connected to a word line 20. On the other hand, the P-channel transistor 16 has a drain and a source connected in series in a reading bit or digit line 22, a floating gate FG located above a channel region between the source and the drain through a gate insulator, and a control gate G located above the floating gate FG through another gate insulator and connected to the word line 20. The floating gate FG of the N-channel transistor 14 and the floating gate FG of the P-channel transistor 16 are common to each other, shown in a dotted line in FIG. 1. Also, the control gate G of the N-channel transistor 14 and the control gate G of the P-channel transistor 16 are common to each other.

Figure 2:
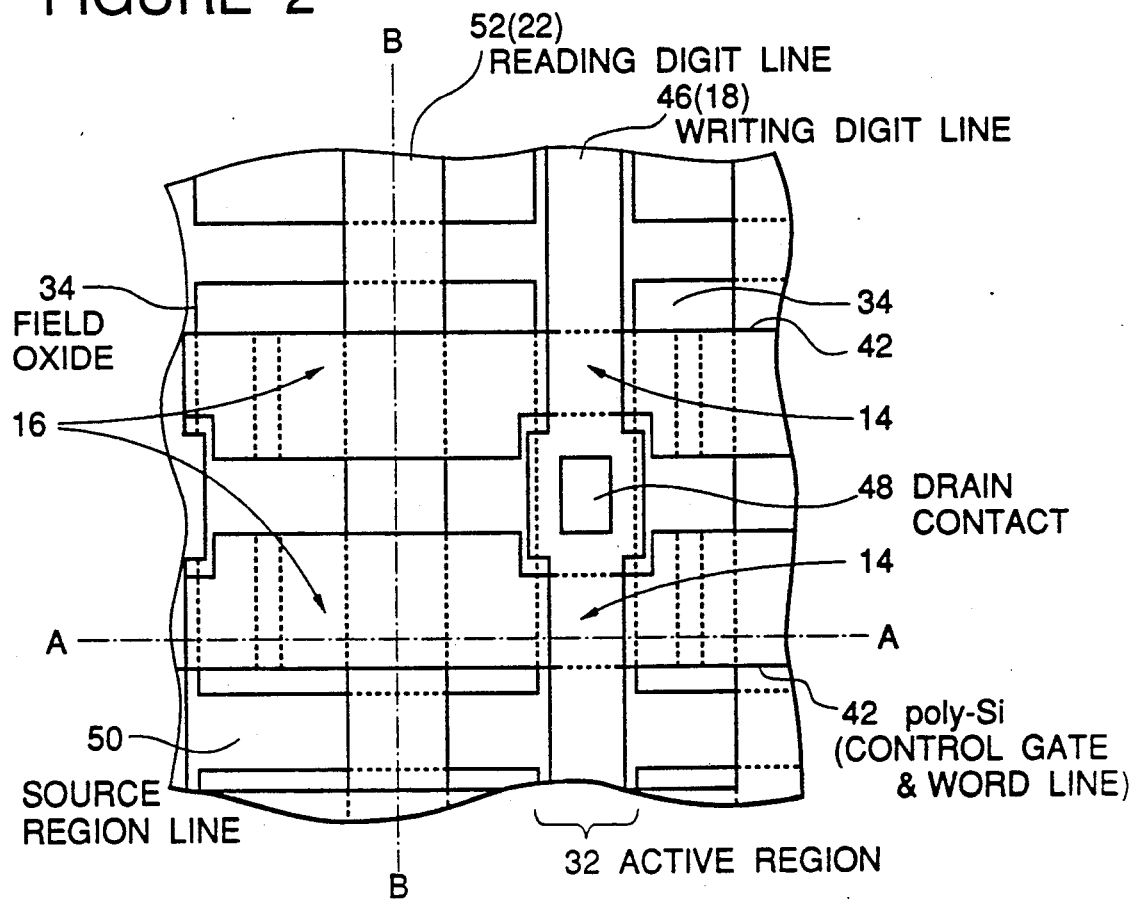
FIG. 2 is a diagrammatic layout pattern of the two-transistor type non-volatile memory shown in FIG. 1.
Figure 3:
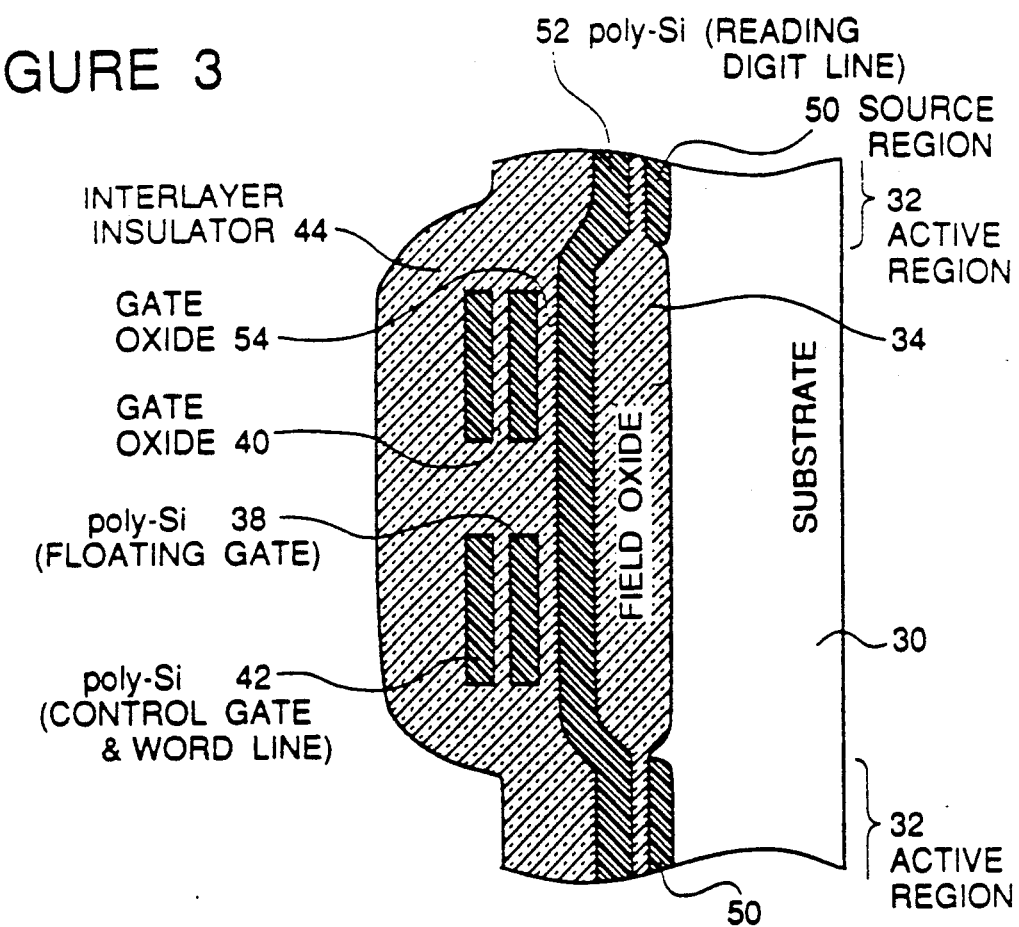
FIG. 3 is a diagrammatic sectional view taken along the line A—A in FIG. 2.
Figure 4:
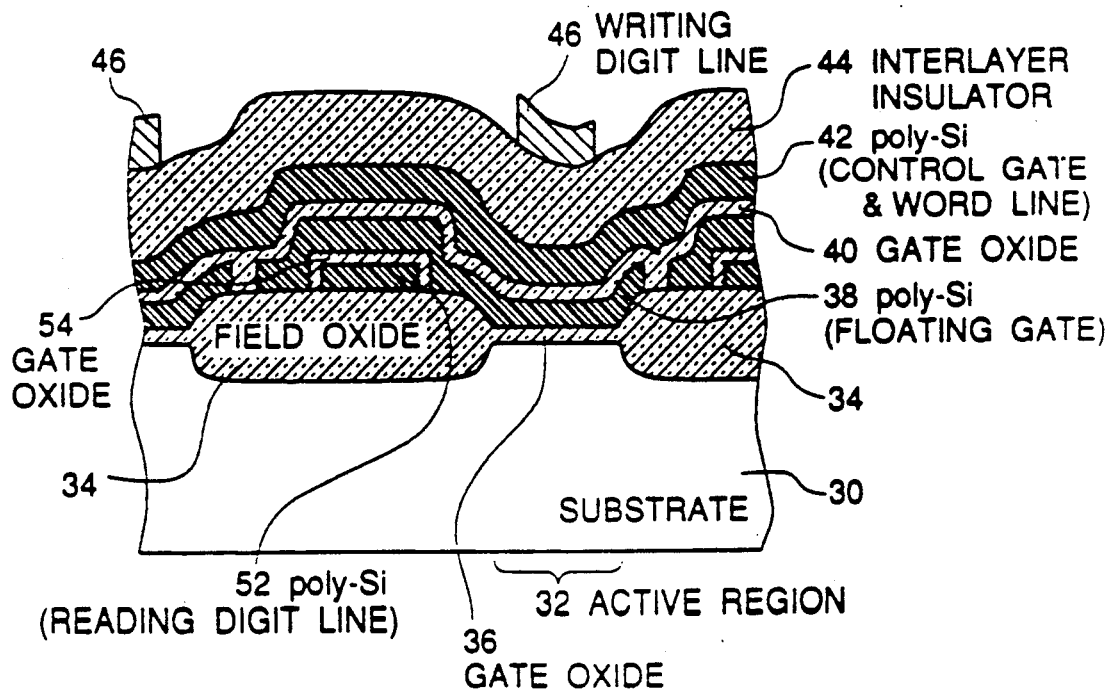
FIG. 4 is a diagrammatic sectional view taken along the line B—B in FIG. 2.

Referring to FIGS. 2, 3 and 4, FIG. 2 shows a diagrammatic layout pattern of the two-transistor type EPROM memory shown in FIG. 1; FIG. 3 shows a diagrammatic sectional view taken along the line A—A in FIG. 2; and FIG. 4 shows a diagrammatic sectional view taken along the line B—B in FIG. 2.

As shown in FIGS. 3 and 4, the EPROM memory is formed on a first conduction type semiconductor substrate 30 such as a P-type silicon substrate. The N-channel transistor 14 of each memory cell is formed in one active region 32 surrounded and defined by device isolation field oxides 34 formed on a pricipal surface of the substrate 30, and the P-channel transistor 16 is formed on one field oxide 34 adjacent to the active region 32 on which the associated N-channel transistor 14. As seen from FIG. 2, the active region 32 is in the form of a lattice or grid pattern, and the field oxides 34 are in the form of an island surrounded by the active region 32.

As seen from FIG. 4, the N-channel transistor 14 includes a first gate oxide 36 formed on the active region 32, a conductive polysilicon layer 38 formed on the first gate oxide 36 so as to form the floating gate FG, a second gate oxide 40 formed on the polysilicon layer 38 for the floating gate, and a conductive polysilicon layer 42 formed on the second gate oxide 40 so as to form the control gate G and the word line 20. In the layout pattern shown in FIG. 2, the stacked layer composed of the polysilicon layer 38, the second gate oxide 40 and the polysilicon layer 42 is patterned in such a manner that a pair of word lines 20 in parallel to and apart from each other extends above one field oxide 34 in a lateral direction. A portion of the active region positioned below the patterned word line 42 constitutes a channel region of the N-channel transistor.

Furthermore, an interlayer insulator 44 is provided to cover the patterned stacked layer composed of the polysilicon layer 38, the second gate oxide 40 and the polysilicon layer 42 and the principal surface of the substrate. A conductor 46 for forming the writing digit line 18 is deposited on the interlayer insulator 44 along a portion of the active region extending vertically in FIG. 2. The conductor 46 is formed with a drain contact 48 at a place positioned between the pair of word lines 20 extending laterally above the same field oxide 34 in FIG. 2, so that the conductor 46 is electrically connected to a drain region (not shown) formed in the substrate adjacent to the channel region. As seen from comparison between FIGS. 1 and 2, one drain region and one drain contact are provided commonly to two N-channel transistors adjacent to each other along the writing digit line. A portion of the active region adjacent to the channel region opposite to the drain region is formed with a source region, which is connected to a source region line 50 formed in a portion of the active region 32 extending laterally in FIG. 2. This source region line 50 is formed on the principal surface of the substrate 30 as shown in FIG. 2.

The P-channel transistor 16 includes a polysilicon layer 52 formed on the field oxide 34 so as to constitute the source, the channel and drain of the P-channel transistor as well as the reading digit line 22. A third gate oxide 54 is formed on the polysilicon layer 52, and the polysilicon layer 38 extends over the third gate oxide 54 so as to form the floating gate FG of the P-channel transistor. The second gate oxide 40 also extends over the floating gate of the P-channel transistor, and the polysilicon layer 42 extends over on the second gate oxide 40 for the P-channel transistor so as to form the control gate G of the P-channel transistor. Therefore, the polysilicon layer 38 for the floating gate and the polysilicon layer 42 for the control gate are common to the N-channel transistor and the P-channel transistor. In the layout pattern shown in FIG. 2, the stacked layer composed of the polysilicon layer 52, the third gate oxide 54, the polysilicon layer 38, the second gate oxide 40 and the polysilicon layer 42 all on the field oxide 34 is patterned in conformity with the pair of word lines 20. A portion of the polysilicon layer 52 positioned under the patterned word line constitutes a channel region of the P-channel transistor. As seen from FIGS. 1, 2 and 3, two P-channel transistors are formed on the same filed oxide 34.

With the above mentioned arrangement, the substrate channel for the N-channel writing transistor 14 is set to have an impurity concentration for optimizing a generation efficiency of hot electrons, similarly to the conventional EPROMs. For example, the N-channel writing transistor 14 has a threshold of about 3.0 to 3.5 volts in an unwritten condition. On the other hand, the polysilicon layer 52 forming the channel region of the P-channel transistor 16 formed on the device isolation field oxide 34 is set to have an impurity concentration for allowing the P-channel transistor 16 to have a weak negative threshold of -0.4 to -0.5 volts.

Under this condition, if a writing is performed for the N-channel transistor 14 in a conventional manner, electrons are injected into the polysilicon layer 38 for the floating gate FG in the N-channel transistor. Because of the injected electrons, the floating gate FG is negatively charged. Since the floating gate FG is common to the N-channel transistor 14 and the P-channel transistor 16, positive charges are induced on the surface of the polysilicon layer 52. Namely, the channel of the P-channel transistor is brought into a turned-on condition. In other words, the P-channel transistor apparently assumes the depletion type.

As a result, the P-channel transistor will have a behavior similar to a MOS transistor which is brought into a depletion type because of ion injection in a mask ROM of the "series arrangement", and therefore, a NAND type logic structure can be obtained.

In the above mentioned EPROM, since the ON current is given by the channel current of the depletion MOS transistor, the ON current can be made to have a sufficiently large value. Therefore, it is possible to execute the reading at a high speed, similarly to the conventional two-transistor type EPROM cell. In addition, since the writing characteristics of the writing transistor can be utilized without deterioration, the writing characteristics similar to the conventional two-transistor type EPROM cell can be obtained.

Figure 5:
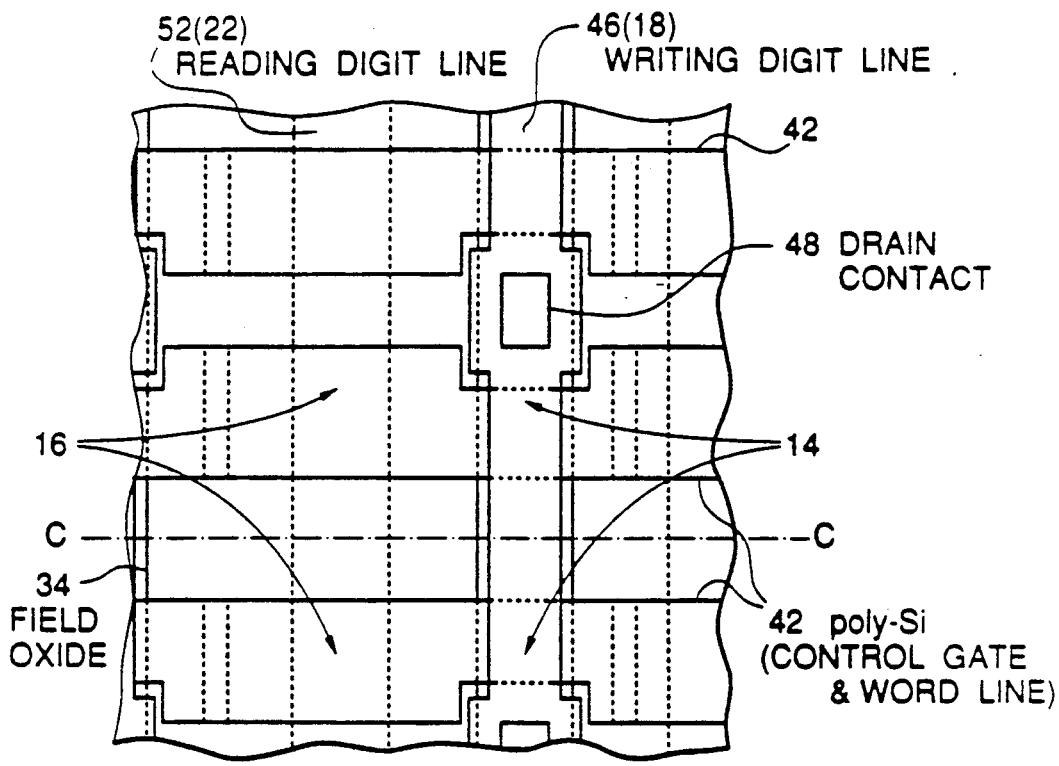
FIG. 5 is a diagrammatic layout pattern of a second embodiment of the two-transistor type non-volatile memory in accordance with the present invention.
Figure 6:
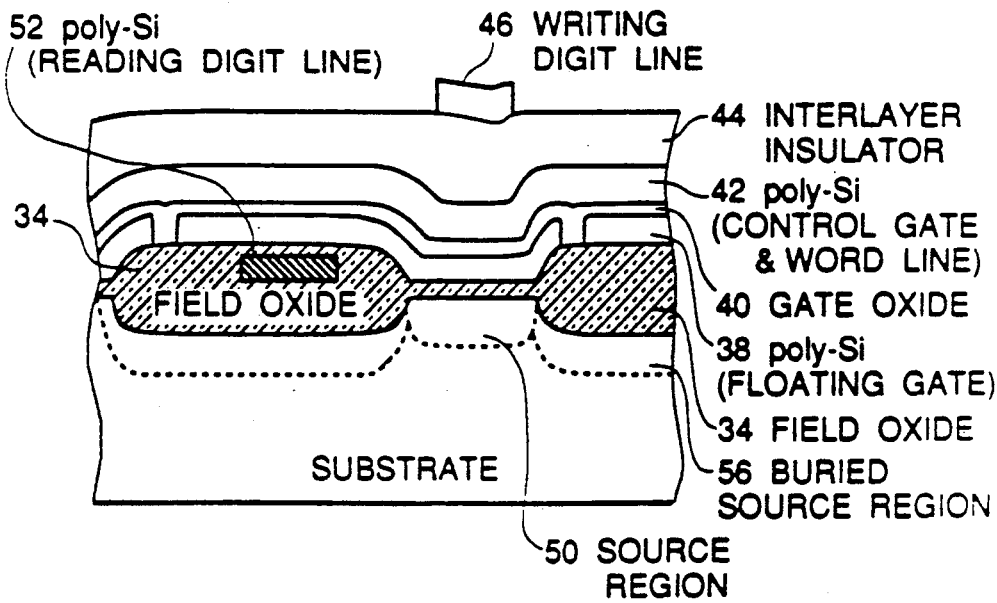
FIG. 6 is a diagrammatic sectional view taken along the line C—C in FIG. 5.

Turning to FIGS. 5 and 6, FIG. 5 shows a diagrammatic layout pattern of a second embodiment of the two-transistor type EPROM memory in accordance with the present invention, and FIG. 6 shows a diagrammatic sectional view taken along the line C—C in FIG. 5. In these figures, elements similar to those shown in FIGS. 2, 3 and 4 are given the same Reference Numerals.

As seen from comparison between FIG. 4 and 6, the second embodiment is such that the polysilicon layer 52 for constituting the source, the channel and the drain of the P-channel transistor as well as the reading digit line 22 is provided within a trench formed in the device isolation field oxide 34, the trench having a depth sufficiently shallow as compared with a thickness of the field oxide 34. The polysilicon layer 52 within the trench formed in the field oxide 34 is covered with the third gate oxide so that an upper surface of the third gate oxide is coplanar with an upper surface of the field oxide 34. With this arrangement, it is possible to avoid a stepped portion which is generated in the polysilicon layer 38 for the floating gate and in the polysilicon layer 42 for the control gate in the case that the polysilicon layer 52 is formed above the field oxide 34.

As shown in FIG. 6, in the second embodiment, the source region 50 of the N-channel transistor is connected to a buried source region 56 which is of the same conduciton type as that of the source region 50 and which is formed under the field oxide 34, so that the source regions of all N-channel transistors located along one word line 20 are mutually connected by the buried source region 56. Therefore, since it is becomes unnecessary to form the source region line 50 on the principal surface of the substrate 30, it is possible to reduce the cell size in the direction of the digit line. In other word, the field oxide 34 can be continuous in the direction of the digit line.

As seen from the above description of the embodiments with reference to the accompanying drawings, the two-transistor type EPROM in accordance with the present invention is characterized in that the reading transistor is formed by using, as a substrate or a channel region, the polysilicon layer deposited in the device isolation field oxide, and also the reading transistor is composed of the MOS transistor of the channel conduction type opposite to that of the writing transistor, so that when the writing transistor is written, the reading transistor is apparently brought into a depletion type by function of the floating gate common to both of the writing transistor and the reading transistor. In addition, with this arrangement, the reading transistors of respective memory cells can be connected in the "series arrangement", namely, in series in a corresponding reading digit line. As a result, since a drain contact for each reading transistor becomes unnecessary, it is possible to reduce the cell size in the digit line direction as compared with the conventional two-transistor type EPROM. Furthermore, since the reading transistor is formed on the device isolation field oxide, it is possible to reduce the interval of the writing transistors and the interval of the reading transistors. Therefore, it is possible to reduce the cell size in the word line direction.

The invention has thus been shown and described with reference to the specific embodiments. However, it should be noted that the present invention is in no way limited to the details of the illustrated structures but changes and modifications may be made within the scope of the appended claims.

I claims:

1. A non-volatile semiconductor memory comprising a semiconductor substrate of a first conduction type having an active region defined by a field isolation region formed on a principal surface of the substrare; and a non-volatile memory cell composed of a first transistor for programming and a second transistor for reading, said first transistor including a source region and a drain region both formed in said active region separately from each other, both of said source region and said drain region being of a second conduction type different from said first conduction type, a floating gate formed through an insulating layer above a portion of said active region between said source region and said drain region, and a control gate formed through an insulating layer above said floating gate, and said second transistor including a source region and a drain region both formed in a conductive semiconductor layer located in said field isolation region, a floating gate formed through an insulating layer above a portion of said conductive semiconductor layer between said source region and said drain region, and a control gate formed through an insulating layer above said floating gate, said floating gate of said second transistor being formed of an extension of said floating gate of said first transistor, and said control gate of said second transistor being connected commonly to said control gate of said first transistor.

2. A non-volatile semiconductor memory claimed in claim 1 wherein said conductive semiconductor layer in which both of said source region and said drain region of said second transistor is deposited on said field isolation region.

3. A non-volatile semiconductor memory claimed in claim 1 wherein said conductive semiconductor layer in which both of said source region and said drain region of said second transistor is formed in a trench formed within said field isolation region, and the insulating layer between said conductive semiconductor layer and said floating gate of said second transistor is formed within said trench above said conductive semiconductor layer so that an upper surface of said insulating layer is coplanar with an upper surface of said field isolation region.

4. A non-volatile semiconductor memory claimed in claim 1 wherein said control gate of said first transistor and said control gate of said second transistor are formed of the same conducting layer which forms a word line, and wherein one of said source and said drain of said first transistor is connected to a writing digit line, and said conductive semiconductor layer extends to form a reading digit line so that said source and said drain of said second transistor is connected in series in said reading digit line.

5. A non-volatile semiconductor memory claimed in claim 4 further including an interlayer insulator provided to cover said control gate of said first transistor and said control gate of said second transistor and said principal surface of said substrate, and a conductor formed on said interlayer insulator so as to form said writing digit line and connected through a contact hole to said one of said source and said drain of said first transistor.

6. A non-volatile semiconductor memory claimed in claim 5 wherein a source region interconnection region is formed on said principal surface of said substrate to extend in a direction substantially perpendicular to a direction of said conductor of said writing digit line, so that source regions of first transistors arranged in a line along said direction substantially perpendicular to the direction of said conductor of said writing digit line are mutually interconnected by said source region interconnection region.

7. A non-volatile semiconductor memory claimed in claim 5 wherein a buried source region is formed in said substrate under each of field isolation regions so that source regions of first transistors arranged in a line along said direction substantially perpendicular to a direction of said conductor of said writing digit line are mutually interconnected by said buried source regions.

* * * * *